(12) United States Patent
Melf et al.

(10) Patent No.: US 6,568,069 B1
(45) Date of Patent: *May 27, 2003

(54) APPARATUS FOR MANUFACTURE OF ELECTRICAL ASSEMBLIES

(75) Inventors: Johann Melf, Muensing (DE); Hugo Goller, Munich (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/805,239

(22) Filed: Feb. 24, 1997

(51) Int. Cl.[7] ................................................ H05K 3/30
(52) U.S. Cl. ............................ 29/740; 29/712; 29/743; 29/759; 29/DIG. 44; 29/832
(58) Field of Search ........................ 29/712, 740, 741, 29/742, 743, 759, DIG. 44, 832

(56) References Cited

U.S. PATENT DOCUMENTS

| | | | |
|---|---|---|---|
| 4,631,812 A | 12/1986 | Young | |
| 4,748,740 A | * 6/1988 | Buck et al. | ................... 29/740 |
| 4,836,111 A | 6/1989 | Kaufmann | |
| 4,875,285 A | 10/1989 | Haan et al. | |
| 4,951,383 A | * 8/1990 | Amao et al. | ................... 29/721 |
| 5,002,448 A | 3/1991 | Kamijima et al. | |
| 5,203,061 A | 4/1993 | Hamada | |
| 5,323,528 A | * 6/1994 | Baker | ........................... 29/721 |
| 5,509,193 A | * 4/1996 | Nuxoll | ........................ 29/741 |
| 5,692,292 A | * 12/1997 | Asai et al. | ..................... 29/740 |
| 5,778,525 A | * 7/1998 | Hata et al. | ..................... 29/836 |

FOREIGN PATENT DOCUMENTS

| | | | | |
|---|---|---|---|---|
| DE | 004301585 | * | 1/1992 | ................... 29/739 |
| EP | 0 315 799 | | 5/1989 | |
| GB | 2 173 426 | | 10/1986 | |

* cited by examiner

*Primary Examiner*—Richard Chang
(74) *Attorney, Agent, or Firm*—Harness, Dickey & Pierce PLC.

(57) ABSTRACT

An apparatus for assembling components on printed circuit boards has a central region having two linear guides proceeding parallel in close proximity to one another, and carriages being displaceable on these guides. Each of the carriages has a transverse beam projecting outwardly therefrom, on which a processing head is movable, and the beams of the carriages on one side of the longitudinal guides extend in an opposite direction to the beams of the other side. The two separate processing locations are provided independently served by one or the other of the carriages. Thus, a high processing capacity is obtained.

16 Claims, 1 Drawing Sheet

APPARATUS FOR MANUFACTURE OF ELECTRICAL ASSEMBLIES

BACKGROUND OF THE INVENTION

The present invention is directed to an apparatus for manufacturing electrical assemblies, particularly for equipping printed circuit boards with electrical components, wherein the apparatus comprises a chassis with two linear longitudinal guides extending essentially parallel to one another for at least two carriages, for example beam-like carriages, which are movable on the guides and respectively provided with transverse bars that comprise transverse guides residing transversely for longitudinal guidance for at least one processing head for the assembly, which head is displaceable thereon.

U.S. Pat. No. 5,002,448, whose disclosure is incorporated herein by reference thereto, discloses an assembly device which has two beam-like carriages that are guided on two guide rails of a chassis, which rails are spaced apart and extend parallel to one another. Each of the carriages comprises a double-bearing at one end, which double-bearing engages one rail and serves for the exact longitudinal guidance and for adherence to the angular position of the carriage relative to the one guide rail. A simple bearing at the opposite end serves the purpose of supporting the transverse bar at this other guide rail.

The simple bearings herein, in fact, also exhibit guide properties that, however, lead to an over-definition of the bearing system and are basically not required. Here, the bearings are allocated to one another so that a double-bearing of the first carriage is respectively arranged at one side and a simple bearing of the other carriage is respectively arranged at the opposite side. Each double-bearing has a drive unit allocated to it, which will drive the carriage in the direction of the longitudinal guide. The two transverse bars are provided with transverse guides on which a triple-equipping head is respectively displaceable and is displaceable between a component delivery unit at the processing location of the chassis for the assembly in order to convey components obtained from the component delivery units up to their equipping location on the printed circuit board.

When it is assumed that the simple bearings, such as, for example, according to U.S. Pat. No. 4,836,111, whose disclosure is incorporated herein by reference thereto, should not have a guide function but only a supporting function, then it can be defined that each carriage is guided at one side along the longitudinal guide. The two carriages thus project from the longitudinal guides to the longitudinal guides lying there opposite, i.e., in opposite directions to one another.

An equipping location for an assembly is located between the two longitudinal guides. The two carriages are matched to one another in terms of their function so that they respectively place the components on the printed circuit boards or, respectively, obtain the components from the component delivery location in alternation.

European 0 315 799 and U.S. Pat. No. 4,875,285, whose disclosure is incorporated herein by reference thereto, for example, discloses an automatic equipping unit for printed circuit boards, wherein the equipping head is fashioned as a turret head for simultaneously picking up, for example, twelve components. It can thus occur that the two equipping heads simultaneously place components onto the printed circuit board and, thereby, mutually impede one another, particularly given large printed circuit boards.

SUMMARY OF THE INVENTION

The present invention is based on the object of enhancing the equipping capacity of an apparatus and reducing the manufacturing outlay for the apparatus, as well as facilitating accessibility to the apparatus.

This object is achieved in a means or apparatus for manufacturing electrical assemblies, particularly for equipping printed circuit boards with electrical components, which apparatus has a chassis with two linear longitudinal guides essentially parallel to one another for at least two carriages, for example beam-like carriages, which are displaceable on the guides, said carriages being provided with a transverse bar that comprises a transversely-residing transverse guide for a longitudinal guidance for at least one processing head for the printed circuit board being displaceable on the transverse guide, the carriages being guided in the longitudinal guides in an end region, and wherein the chassis comprises at least one processing location for at least one of the assemblies. The improvements are that the two longitudinal guides are arranged immediately adjacent to one another and the two transverse carriers respectively project from the longitudinal guides into a direction facing away from the neighboring longitudinal guide and at least two processing locations are provided on both sides of the longitudinal guide.

The processing heads can be differently fashioned so that they are suitable not only for equipping but also for hoop-soldering, measuring checking or testing printed circuit or, respectively, assembly. Other processing heads can be provided, for example, for applying fluxing agent, adhesive or solder paste.

As a result of the central arrangement of the guide rails and the transverse bars directed away from one another in, for example, the beam-like carriages, it is possible to simultaneously process two assemblies given comparable apparatus outlay without having the processing heads mutually impede one another. Another advantage is that only one shared control means is required for the two processing locations.

It is thereby possible to significantly enhance the processing capacity of the machine. As a result of the central arrangement of the longitudinal guides, the accessibility to the machine from the outside is substantially improved, with it being possible to also arrange the component deliveries at the outside of the machine to extend parallel to the longitudinal guides. As a result of the centralization of the longitudinal guides, in addition, the leads to the drives can also be combined in the middle. The carriers for the two longitudinal guides can be structurally connected to one another so that they mutually reinforce one another.

A table and compact structure of the supporting structure will occur due to the shared longitudinal carrier, wherein the two longitudinal guides are fashioned as a common longitudinal carrier of the chassis, so that the chassis can be cost-beneficially constructed. A beneficial center of mass also occurs in the middle, as a result whereof the vibration behavior is also improved and the stability of the chassis is enhanced.

As a result of the drive units, which are allocated to the longitudinal guides for displacing the carriages, the drive units and the guide means for the carriages can be compactly combined, which will enable a weight-saving and stable embodiment.

Preferably, an assembly transport comprising a conveyor direction oriented perpendicular to the longitudinal guides will service both processing locations. Thus, the printed circuit boards can be conducted to both processing locations in one conveyor line.

If the apparatus has the chassis having at least one linear longitudinal guide for at least one carriage, for example a beam-like carriage displaceable on the guide, and the improvement includes that two carriages are movable independent of one another are guided on this guide, it is possible to further enhance the processing capacity of the machine. For example, it is thereby also possible to allocate a different plurality of carriages to the two longitudinal guides. In addition, the processing heads can exercise different functions. A respectively optimum configuration of processing heads can be formed in this way for different processing jobs.

If the supporting and guide elements are arranged at the end of the carriage, and if the longitudinal guide is provided with at least one supporting path and at least one guideway for the corresponding supporting guide elements, it makes it possible to fashion a transverse bar freely projecting at its free end so that no guide or support means is required. The accessibility to the work area of the machine is thus further improved. It then is also possible to arrange peripheral devices as additional component magazines or other auxiliary devices along the outside of the apparatus adjacent to the free ends of the carriages.

The supporting and guideways lying perpendicularly above one another require less structure width than given a horizontal arrangement. The overall width of the machine can thus be correspondingly reduced. Moreover, all supporting and guideways of both longitudinal guides can be beneficially combined into one carrier part having a compact structure.

Preferably, the drive unit for each carriage is fashioned as a linear motor and is allocated to the linear guide. Since the linear motor requires no additional drive means, such as spindles or toothed belts, the use of a plurality of carriages at the longitudinal guide is facilitated by the use of the linear motors. Such a linear motor is composed of a stationary part, for example a magnetic rail, that extends over the entire length of the longitudinal guide. An electromagnetically active part is allocated to the carriage, and this is located in close interactive connection with the magnetic rail and is controllable, so that the carriage can be moved into the exact predetermined position. Preferably, the linear motor is arranged between the supporting path and the guideway. This arrangement allows the guide and drive means for the carriage to be combined to form a compact and space-saving arrangement.

Preferably, a parting gap lies between the mobile part and the stationary part of the linear motor in the region of the supporting path and guideway, and this parting gap and mutual contacting surfaces between the guide elements of the longitudinal guide form a through common parting seam, so that the guide element of the longitudinal guide and the parts of the linear motor cooperate in an especially advantageous way. The magnetic forces of the linear motor are utilized for drawing the supporting and guide elements of the carriage against the support and guideways of the longitudinal guide play-free and in a defined fashion, so that the transverse guide of the carriage is held in an exact angular and height position, and the guide means engaging therebehind can be foregone. The longitudinal guide thus requires, for example, only one real-like guideway and the supporting path proceeding parallel thereto for exact longitudinal guidance and for adherence to the angular position of the transverse bar relative to the chassis. The permanent attractive forces of the magnetic rail are so high that the carriage is reliably held at the longitudinal guide, even after the linear motor is shut off.

Preferably, the stationary bar is provided as a common stationary element for a plurality of independently-actuatable linear motors of the carriages, and the stationary part is rigidly connected to the longitudinal carrier of the chassis. Thus, only a single stationary part is required for the mobile parts of the linear motor. This single stationary part is constructed, for example, as a simple magnetic rail and is embedded in the longitudinal carrier in a space-saving fashion.

Other advantages and features of the invention will be readily apparent from the following description of the exemplary embodiment, the drawings and claims.

DESCRIPTION OF THE PREFERRED EMBODIMENT

Figure 1:
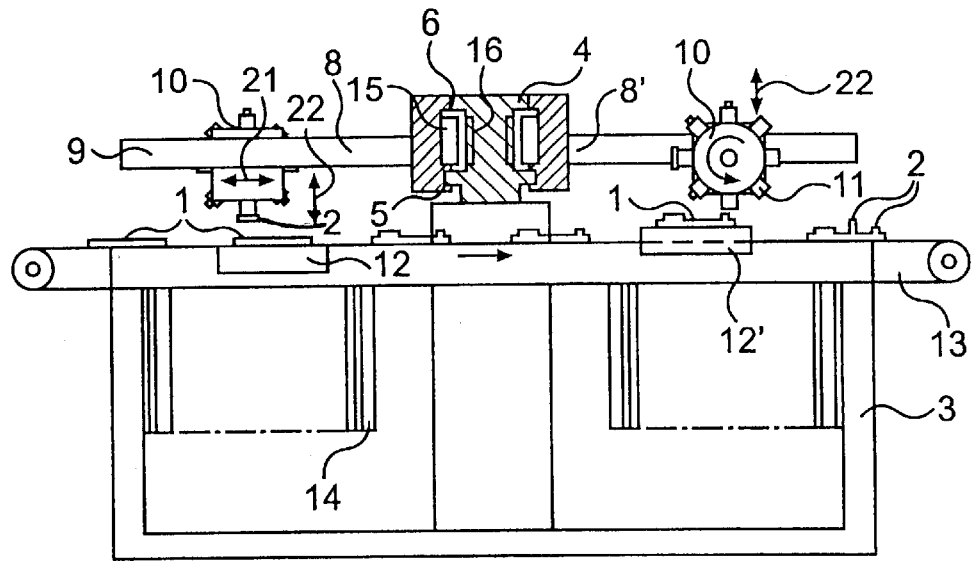
FIG. 1 is a side view with portions broken away for purposes of illustration of an arrangement for equipping printed circuit boards.
Figure 2:
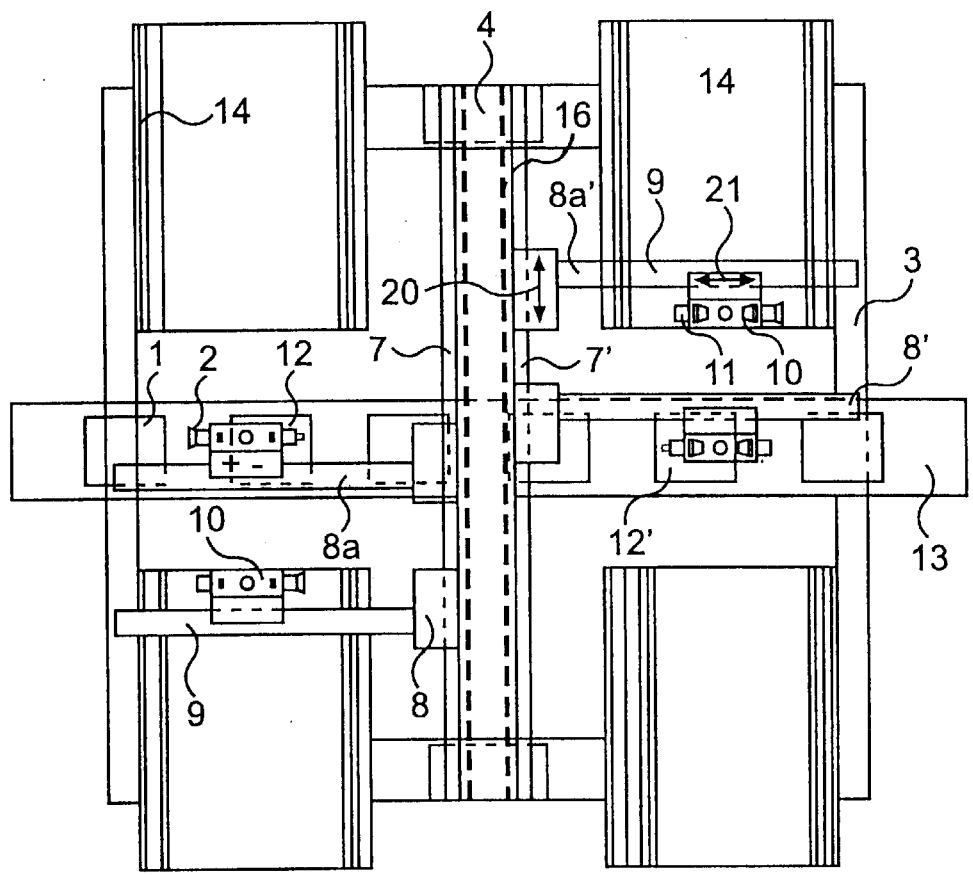
FIG. 2 is a plan view of the arrangement of FIG. 1.

The principles of the present invention are particularly useful when incorporated in the arrangement illustrated in FIGS. 1 and 2 for equipping printed circuit boards 1 with electrical components 2. The arrangement includes a chassis or frame 3 with a longitudinal carrier 4, wherein the printed circuit boards 1 and components 2 are combined to form an assembly 1, 2. Horizontally-extending guideways 5 and supporting paths 6 are arranged lying perpendicularly above one another along the longitudinal carrier 4, so that together they form a perpendicular guide level or plane of a linear longitudinal guide 7 for at least one carriage 8 correspondingly horizontally displaceable in this direction. Each of the carriages includes a transverse bar 9 extending in the horizontal direction perpendicular to the guideway 7.

Each of the bars 9 is provided with a transverse guide (not shown in detail) for a processing head 10 fashioned as an equipping head that, for example, is designed as a turret head and comprises a plurality of suction-type pipettes 11 for grabbing the components. Thus, each of the pipettes 11 extends out star-shaped or as spokes from the head, as illustrated. A processing location 12 of the chassis 3 is arranged in the middle working region of the processing head 10, and this processing location 12 is fashioned as an elevating platform for lifting the printed circuit boards 1 to be processed to a processing height.

Thus, the head 10 can be moved in a first direction (see arrow 20, FIG. 2) parallel to the guide 7 and in a second direction (see arrow 21, FIGS. 1 and 2) parallel to the bar 9 and perpendicular to the guide 7. Each of the pipettes 11 of the turret head 10 is movable radially in the head 10 in a third direction (see arrow 22, FIG. 1) perpendicular to the guide 7 and the bar 9 similar to the pipettes of the turret of U.S. Pat. No. 4,875,285.

A linear assembly transport 13 extends perpendicular to the longitudinal guide 7 over the entire width of the chassis 3. Component deliveries, sources or storage devices 14 are arranged on both sides of the printed circuit board transport arrangement 13. The processing heads 10 can fetch components 2 as needed from these component deliveries or storage devices 14 and place them into the printed circuit board 1, which is positioned on the elevating platform 12.

The longitudinal carrier 4 is provided with longitudinal guides 7 on both sides, and at least one additional carriage 8' is guided thereon and extends in the opposite direction from the first carriage 8.

The two carriages 8 and 8' project outwardly in opposite directions and proceed from the center longitudinal guides 7 and 7'. Accordingly, an additional processing location 12' for equipping the printed circuit boards 1 with the components 2 is provided on the second side. Thus, the printed circuit board transport 13 is conducted over both processing locations 12 and 12'. In this way, for example, it is possible to work simultaneously with two processing heads 10 at two processing locations and to correspondingly increase the equipping capacity.

The arrangement also has the advantage that the plurality of component deliveries can be doubled, so that a substantially greater spectrum of components can be offered for processing at one machine.

As illustrated in FIG. 2, the two carriages with the equipping heads 10 are provided here at each of the longitudinal guides 7 and 7', as a result whereof the equipping capacity of the means is further enhanced. Thus, carriages 8 and 8a extend from the guide 7 and carriages 8' and 8a' extend from the guide 7'. The two equipping heads are then controlled so that they equip or, respectively, fetch components from the component deliveries or sources 14 in alternation. In other words, while one equipping head is applying an element, the other head is receiving elements from storage or supply components.

The drive unit for displacing the carriage 4 is fashioned, here, as a linear motor 15, 16 that is composed of an electromagnetically active, mobile part 15 and the stationary magnetic rail 16 that extends over the entire length of the longitudinal guide 7 and is formed in the central longitudinal carrier 4. The guideways 5 and the pathways 6, which form contacting surfaces are arranged to lie above one another in a space-saving fashion. The linear motor composed of the parts 15 and 16 comprises a correspondingly perpendicularly-residing magnetic parting gap between the mobile part 15 and the magnetic rail 16. The mutual contacting surfaces 5 and 6 of the longitudinal guide and of the parting gap of the linear motor form a common, through parting seam. What this effects is that the guide and support elements of the carriages 8, 8a, 8' and 8a' are drawn play-free against the guideways and supporting paths 5 and 6 of the longitudinal guide 7 due to the magnetic attractive force of the parts of the linear motor.

These forces are so high that the other end of the carriage, for example the free end of the transverse bar 9, does not require any support and can be fashioned to project freely in a cantilever manner. Row supporting paths are thus not required at the free end of the bar 9, as a result whereof the accessibility of the working area of the machine is improved. The permanent magnetic forces of the linear motor hold the carriage in its horizontal position, even after the current has been shut off.

All of the carriages are fashioned structurally identical here and are rotationally symmetrically arranged on both sides of the arrangement. The linear motors allocated to the individual carriages 8 are fashioned so that they use a common magnetic rail or stationary part 16.

Although various minor modifications may be suggested by those versed in the art, it should be understood that we wish to embody within the scope of the patent granted hereon all such modifications as reasonably and properly come within the scope of our contribution to the art.

We claim:

1. An apparatus for equipping printed circuit boards with electrical components, said apparatus having a chassis with two linear longitudinal guides extending essentially parallel to one another in a first direction with the guides being immediately adjacent to one another and facing away from each other, at least one carriage being displaceable on each longitudinal guide, each carriage having a transverse bar extending from the carriage in a second direction substantially perpendicular to the first direction, each transverse bar providing a transverse guide for a longitudinal guidance of at least one processing head for printed circuit boards being displaceable along said second direction on said bar, the bars of the carriages on one of said longitudinal guides extending in an opposite direction to the bars of the carriages associated with the other of the longitudinal guides so that each head is movable in a plane defined by the first and second directions, each head having a nozzle movable in a third direction perpendicular to the plane of the first and second direction for inserting an electrical component on the circuit board, and the chassis having two stationary processing locations for holding two circuit boards, said locations being spaced apart in the second direction with the two longitudinal guides extending therebetween, so that two circuit boards may be simultaneously equipped.

2. An apparatus according to claim 1, wherein the drive units are allocated to the longitudinal guides and are provided for displacing the carriages.

3. An apparatus according to claim 1, wherein the two longitudinal guides are formed on a common longitudinal carrier mounted on the chassis.

4. An apparatus according to claim 1, which includes an assembly transport having a conveying direction in said second direction for servicing both processing locations.

5. An apparatus according to claim 1, wherein each longitudinal guide has at least a supporting path and at least one guideway for a corresponding supporting and guiding of elements of the carriage and a drive unit for each carriage being a linear motor and being allocated to the longitudinal guides.

6. An apparatus according to claim 5, wherein the supporting path and guideway of each longitudinal guide are arranged lying perpendicularly about one another to form a perpendicular oriented guide level.

7. An apparatus according to claim 6, wherein the linear motor is arranged between the supporting path and the guideway.

8. An apparatus according to claim 7, wherein the linear motor has a parting gap lying between a mobile part and a stationary part, which stationary part is positioned between the supporting path and guideway and wherein the parting gap and mutual contacting surfaces of the supporting path and guideway form a through, common parting seam.

9. An apparatus according to claim 8, wherein each linear longitudinal guide has two carriages, and wherein the stationary part is provided as a common stationary element for independent actuatable linear motors of the carriage displaceable along each linear longitudinal guide and the stationary part is rigidly connected to the longitudinal guide.

10. An apparatus according to claim 9, wherein each processing head is a turret head mounted for rotation on an axis extending parallel to the first direction.

11. An apparatus according to claim 1, wherein each of said bars is supported in a cantilevered fashion so that an end opposite the carriage is freely projecting.

12. An apparatus according to claim 1, which includes two carriages being displaceable on each longitudinal guide.

13. An apparatus according to claim 12, wherein each processing head is a turret head mounted to rotate on an axis extending parallel to the first direction.

14. An apparatus for equipping printed circuit boards with electrical components, said apparatus having a chassis with two linear longitudinal guides extending essentially parallel to one another in a first direction with the guides being immediately adjacent to one another and facing away from each other, at least one carriage being displaceable on each longitudinal guide, each carriage having a transverse bar extending from the carriage in a second direction substantially perpendicular to the first direction, each transverse bar providing a transverse guide for a longitudinal guidance of at least one processing head for printed circuit boards being displaceable along said second direction on said bar, the bars of the carriages on one of said longitudinal guides extending in an opposite direction to the bars of the carriages associated with the other of the longitudinal guides so that each head is movable in a plane defined by the first and second directions, each head having a suction nozzle movable in a third direction perpendicular to the plane of the first and second direction for inserting an electrical component on the circuit board, and the chassis having two processing locations for holding two circuit boards, said locations being movable in the third direction and being spaced apart in the second direction with the two longitudinal guides extending therebetween, so that two circuit boards may be simultaneously equipped.

15. An apparatus according to claim 14, which includes two carriages being displaceable on each longitudinal guide.

16. An apparatus according to claim 14, wherein each processing head is a turret head mounted for rotation on an axis extending parallel to the first direction.

\* \* \* \* \*